(12) United States Patent
Huang et al.

(10) Patent No.: US 7,414,448 B2
(45) Date of Patent: Aug. 19, 2008

(54) DUTY CYCLE CORRECTION CIRCUIT

(75) Inventors: Hsien-Sheng Huang, Hsinchu (TW); Chun Shiah, Hsinchu (TW)

(73) Assignee: Etron Technology Inc., Hsinchu (TW)

( * ) Notice: Subject to any disclaimer, the term of this patent is extended or adjusted under 35 U.S.C. 154(b) by 86 days.

(21) Appl. No.: 11/503,064

(22) Filed: Aug. 14, 2006

(65) Prior Publication Data
US 2008/0036517 A1 Feb. 14, 2008

(51) Int. Cl.
*H03K 3/017* (2006.01)
(52) U.S. Cl. ............... 327/175; 327/35; 327/159
(58) Field of Classification Search ......... 327/156, 327/158, 159, 161
See application file for complete search history.

(56) References Cited
U.S. PATENT DOCUMENTS 4,761,568 A * 8/1988 Stronski ............... 327/259
5,361,003 A * 11/1994 Roberts ............... 326/21
6,815,994 B2 * 11/2004 Huber et al. ......... 327/257
7,282,978 B2 * 10/2007 Lee ..................... 327/175
2007/0080732 A1 * 4/2007 Cho ..................... 327/175

* cited by examiner

*Primary Examiner*—N. Drew Richards
*Assistant Examiner*—An T. Luu
(74) *Attorney, Agent, or Firm*—Rosenberg, Klein & Lee (57) ABSTRACT

A duty cycle correction circuit comprises a tuned circuit, a delay circuit and a phase-locked loop; wherein the tuned circuit receives an input clock, generates a periodic pulse according to the input clock, tunes the periodic pulse depending on a reference voltage, and outputs an output clock; a delay circuit receives the output clock, and generates a complementary signal; a phase lock loop receives the complementary signal, measures the periods of time of the high level state and the low level state of the complementary signal, generates the reference voltage and feeds back to the tuned circuit. By using the technique of the present invention, it is able to track the delay time between the input clock and the output clock, and the drift of the output clock is reduced.

14 Claims, 9 Drawing Sheets

DUTY CYCLE CORRECTION CIRCUIT

FIELD OF THE INVENTION

The present invention relates to a duty cycle correction circuit, it is able to track the delay time between the input clock and the output clock, and the drift of the output clock is reduced.

BACKGROUND OF THE INVENTION

A problem in current semiconductor memory system is that the duty cycle of the input clock isn't always unchanged. The rising edge and the falling edge of the input clock may drift back and forth in time domain when memory system is read or written data, which causes data indefinite.

Figure 1:
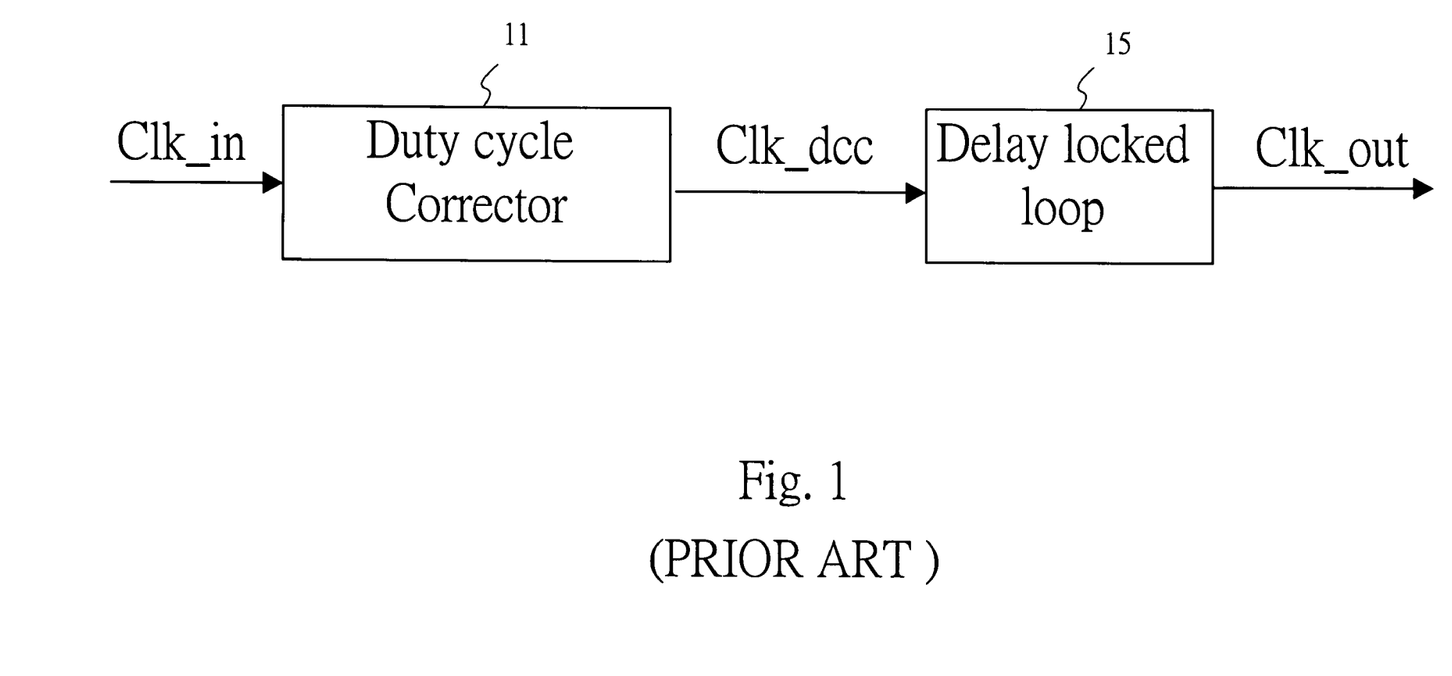
FIG. 1 is a block diagram of prior art duty cycle correction circuit.

Referring to FIG. 1, shows a duty cycle correction circuit of prior art. The circuit comprises a duty cycle corrector 11 and a delay locked loop 15. Wherein the duty cycle corrector 11 receives an input clock (Clk_in), corrects the duty cycle of the input clock (Clk_in), and generates a correction clock (Clk_dcc). The delay locked loop 15 connected to the duty cycle corrector 11 receives the correction clock (Clk_dcc), and generates an output clock (Clk_out).

The delay locked loop 15 requires a first locking times of making the phase of the received correction clock (Clk_dcc) the same as the output clock (Clk_out).

The duty cycle corrector 11 requires a second locking times of making the phase of the received input clock (Clk_in) the same as the correction clock (Clk_dcc).

In accordance with the above prior art skill, which could be improved the drifting condition of the duty cycle. But the duty cycle correction circuit shows by FIG. 1 without the function of feed backing, therefore the delay time between the input clock and the output clock can't be tracked and reproduced.

Besides, the duty cycle correction circuit of the prior art for making the phase of the input clock (Clk_in) can equal the output clock (Clk_out). Whole circuit locking time is the sum of the first and second locking times in the case where the duty cycle corrector 11 and the delay locked loop 15 are serially connected.

The locking time is too long which is causing circuit unsteady. Drifting and phase noise still exist in the correction clock (Clk_dcc) and the output clock (Clk_out) from the duty cycle correction.

SUMMARY OF THE INVENTION

Accordingly, how to design a tracking and feed backing to calibrate the duty cycle of the duty cycle correction circuit with respect to previous mentioned shortcomings of the prior art is key point of the present invention.

It is a primary object of the present invention to provide a duty cycle correction circuit; drifting and locking time of the duty cycle are reduced.

It is a secondary object of the present invention to provide a duty cycle correction circuit, the duty cycle correction circuit for being used to track the delay time between the input clock and the output clock.

It is another object of the present invention to provide a duty cycle correction circuit; the duty cycle correction circuit generates a periodic low level pulse' tunes the low level of the periodic low level pulse depending on a reference voltage, and generates the duty cycle of an output clock is corrected to be 50%.

It is further object of the present invention to provide a duty cycle correction circuit; the duty cycle correction circuit generates a periodic high level pulse' tunes the high level of the periodic high level pulse depending on a reference voltage, and generates the duty cycle of an output clock is corrected to be 50%.

To achieve the previous mentioned objects, the present invention provides a duty cycle correction circuit, comprising a tuned circuit for receiving an input clock and a reference voltage, and generating a periodic low level pulse according to said input clock, tuning said periodic low level pulse depending on said reference voltage, generating an output clock from the output end of said tuned circuit by extending the state of the low level of said periodic low level pulse; a delay circuit connected to the output end of said tuned circuit for receiving said output clock, and generating a first delay clock and a second delay clock, wherein both of clocks are complementary signals with each other; and a phase lock loop connected to said delay circuit for receiving said first delay clock and said second delay clock, and measuring the state time of the high level and low level of said first delay clock and said second delay clock, generating said reference voltage and feed backing to said tuned circuit.

To achieve the previous mentioned objects, the present invention further provides a duty cycle correction circuit, comprising a tuned circuit for receiving an input clock and a reference voltage, and generating a periodic high level pulse according to said input clock, tuning said periodic high level pulse depending on said reference voltage, generating an output clock from the output end of said tuned circuit by extending the state of the high level of said periodic high level pulse; a delay circuit connected to the output end of said tuned circuit for receiving said output clock, and generating a first delay clock and a second delay clock, wherein both of clocks are complementary signals with each other; and a phase lock loop connected to said delay circuit for receiving said first delay clock and said second delay clock, and measuring the state time of the high level and low level of said first delay clock and said second delay clock, generating said reference voltage and feed backing to said tuned circuit.

DETAILED DESCRIPTION OF THE INVENTION

Figure 2:
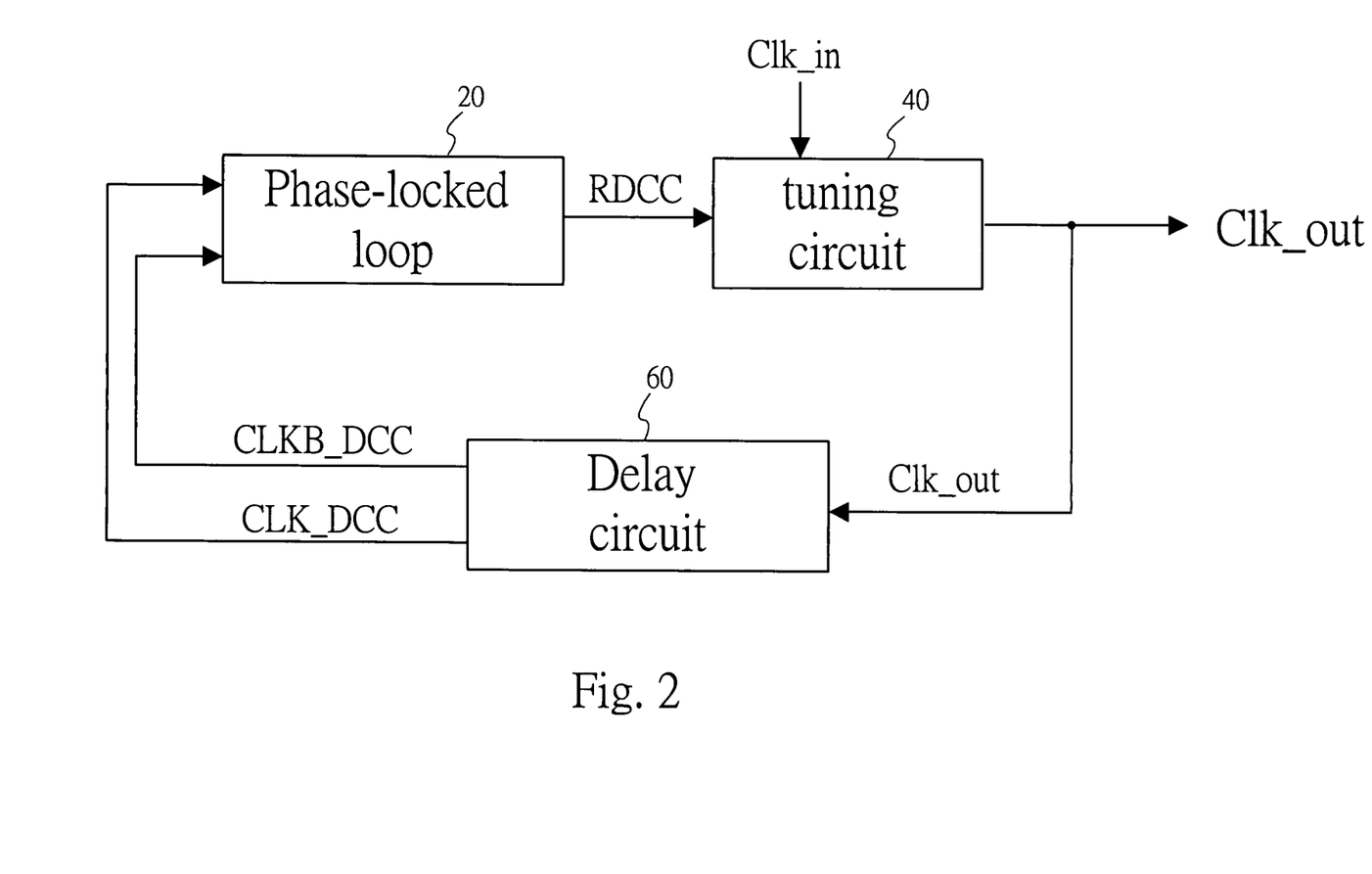
FIG. 2 is a block diagram of a preferred embodiment of the present invention.

Firstly, referring to FIG. 2, is a block diagram of a preferred embodiment of the present invention. The duty cycle correction circuit comprises a tuned circuit 40, a delay circuit 60 and a phase lock loop 20. Wherein tuned circuit 40 is used for receiving and tuning the input clock (Clk_in), and generating an output clock (Clk_out) to the delay circuit 60.

The delay circuit 60 is connected to the tuned circuit 40 for receiving and delaying the output clock (Clk_out), and generating a first delay clock (CLKB_DCC) and a second delay clock (CLK_DCC), wherein both of clocks are complementary signals with each other, and transmitted to the phase lock loop 20. Wherein a delay time exists in the second delay clock (CLK_DCC) with the output clock (Clk_out), and the waveform of the second delay clock (CLK_DCC) and the output clock (Clk_out) are the same. The phase lock loop 20 is connected to the delay circuit 60 for receiving the first delay clock (CLKB_DCC) and the second delay clock (CLK_DCC), measuring the state time of the high level and low level of the first delay clock and the second delay clock, generating the reference voltage (RDCC) and feed backing to the tuned circuit 40. The phase lock loop 20 tunes the input clock (Clk_in) according as the reference voltage (RDCC), and generates the duty cycle of an output clock is corrected to be 50%.

Figure 3:
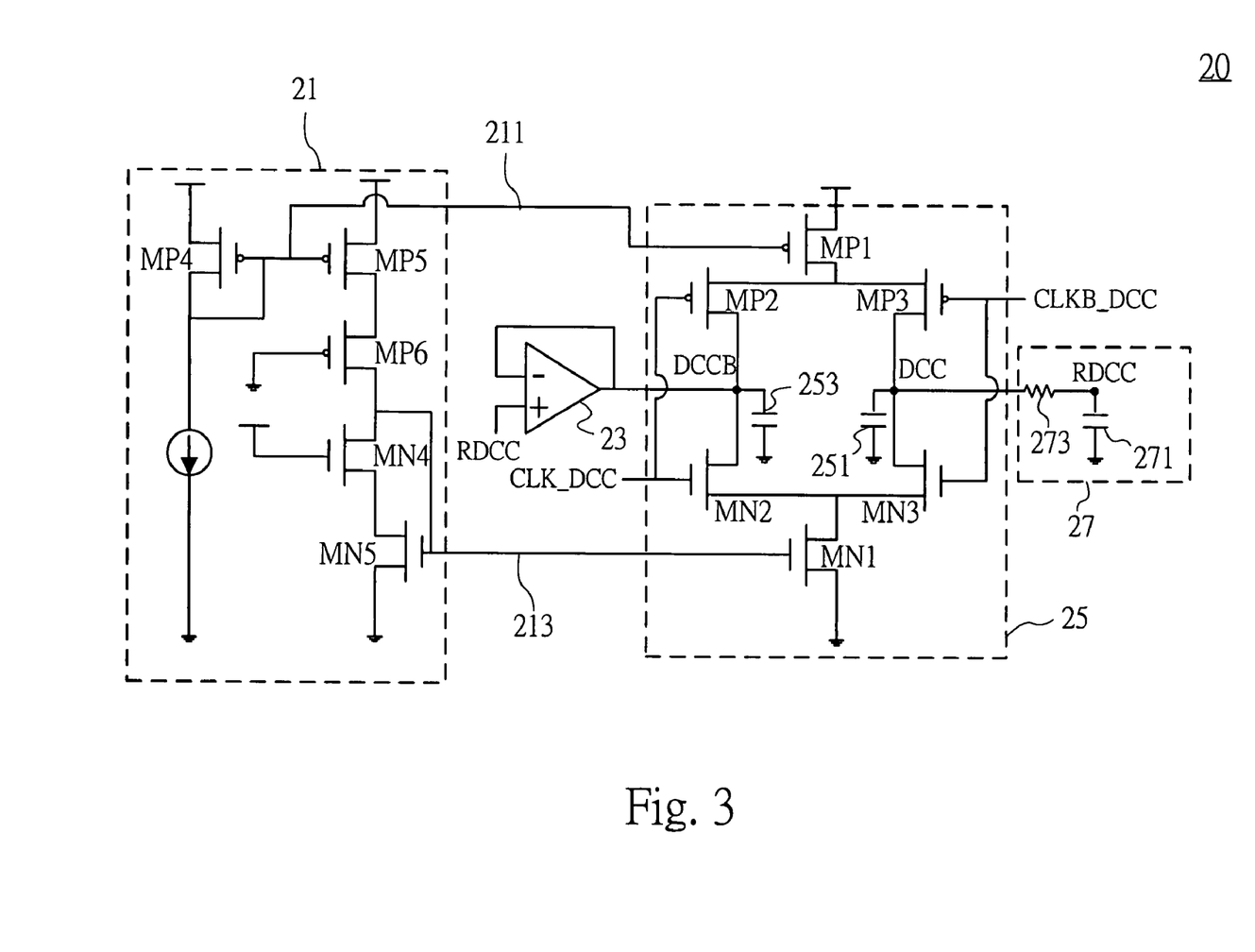
FIG. 3 is a circuit diagram of a phase lock loop of the preferred embodiment of the present invention.

Referring to FIG. 3, is a circuit diagram of a phase lock loop of the preferred embodiment of the present invention. The phase lock loop 20 comprises a bias circuit 21, an operation amplifier 23, a phase comparator 25 and a low pass filter 27.

Wherein the bias circuit 21 comprises MP4, MP5, MP6, MN4 and MN5 transistor to form as a current mirror circuit. The bias circuit generates a first bias signal 211 and a second bias signal 213, and provides driving signal for the phase comparator 25.

The phase comparator 25 comprises a first capacitor 251, a second capacitor 253, MP1, MP2, MP3, MN1, MN2 and MN3 transistor. MP1 and MN1 are source transistor of phase comparator 25 for receiving the first bias signal 211 and the second bias signal 213 which generate respective from the delay circuit 60 to drive the phase comparator 25. The gate of MP3 and MN3 are connected with each other for receiving the first delay clock (CLKB_DCC); and the gate of MP2 and MN2 are connected with each other for receiving the second delay clock (CLK_DCC). The drain of MP3 and MN3 and the first capacitor 251 are connected with each other; the drain of MP3 and MN3 and the second capacitor 253 are connected with each other. The first capacitor 251 and the second capacitor 253 are used for measuring the state time of high level and low level of the first delay clock (CLKB_DCC) and the second delay clock (CLK_DCC). Besides, the first capacitor 251 is connected to the low pass filter 27 and the second capacitor 253 is connected to the operation amplifier 23.

The low pass filter 27 comprises a third capacitor 271 and a resistor 273. The resistor 273 of the low pass filter 27 is connected to the first capacitor 251 of the phase comparator 25. The first capacitor 251 and the second capacitor 253 are used for measuring the state time of high level and low level of the first delay clock (CLKB_DCC) and the second delay clock (CLKB_DCC), so as to generates the reference voltage (RDCC) from the third capacitor 271 of the low pass filter 27. The first delay clock (CLKB_DCC) and the second delay clock (CLKB_DCC) are decided the voltage value of the reference voltage (RDCC).

The operation amplifier 23, the positive input thereof receives the reference voltage (RDCC) from the low pass filter 27, the negative input thereof coupled to the output end to form as a voltage follower, and connected to the second capacitor 253, wherein the second capacitor 253 provides the same value of voltage with the reference voltage (RDCC).

Figure 4:
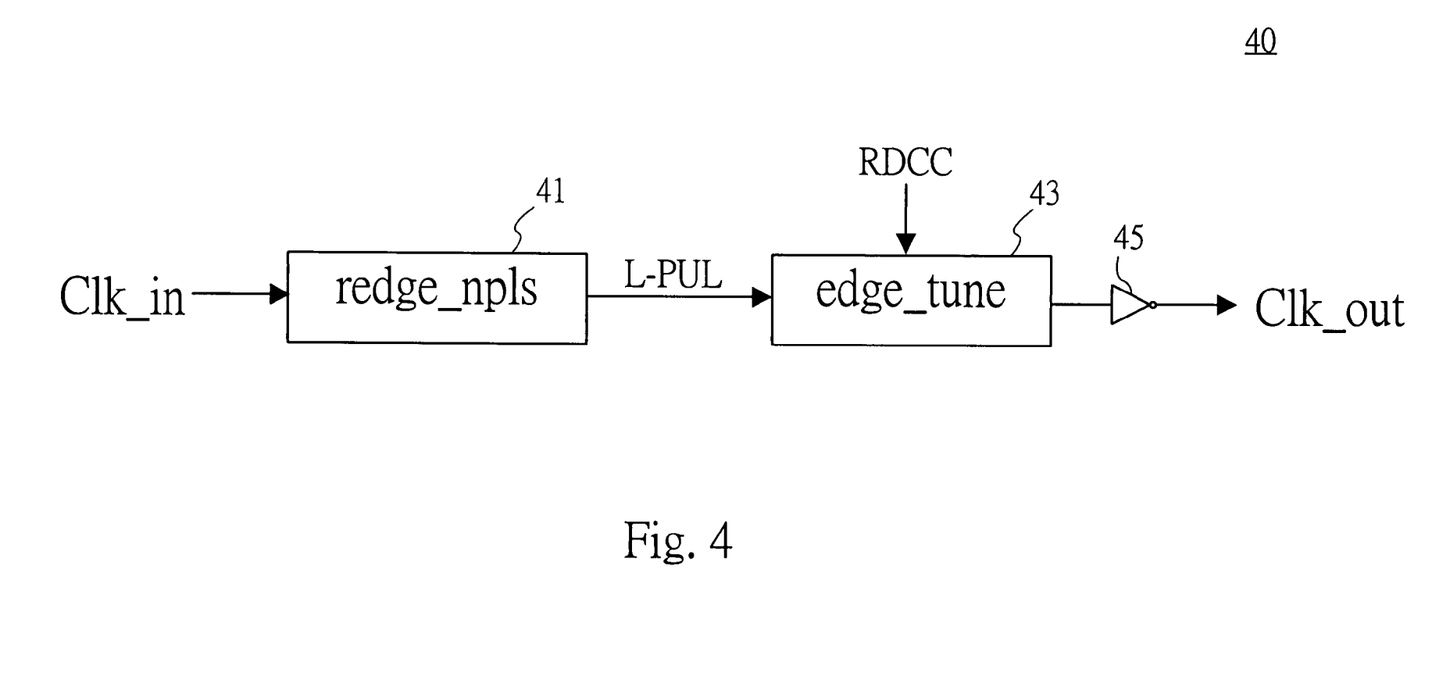
FIG. 4 is a circuit diagram of a tuned circuit of the preferred embodiment of the present invention.

Referring to FIG. 4, is a circuit diagram of a tuned circuit of the preferred embodiment of the present invention. The tuned circuit 40 comprises a pulse generator 41 and a tuner 43.

A pulse generator 41 is used for receiving the input clock (Clk_in), and generating a low level pulse according to the rising edge of the input clock (Clk_in) to form as a periodic low level pulse (L-PUL), wherein the low level pulse (L-PUL) having an initial value is as high level.

The tuner 43 is used for receiving the reference voltage (RDCC) which is feed backing by the low pass filter 27 of the phase lock loop 20, extending the state of the low level of the periodic low level pulse (L-PUL) depending on the reference voltage (RDCC), wherein the state of the low level equals to the state of the high level of the output clock (Clk_out). The tuner 43 further couples to a first inverter 45 of making the phase equaling of the output clock (Clk_out) and the input clock (Clk_in). The execution example is that it only tuning only one edge of clock (the rising edge of the periodic low level pulse) to correct the duty cycle. The corrected result isn't affected by the drifting falling edge of the input clock (Clk_in). The reference voltage (RDCC) is generated from the phase lock loop 20 that is feed backing to the tuned circuit 40, and therefore the delay time of rising edge from the input clock (Clk_in) to the output clock (Clk_out) is fixed and tracked.

Figure 5:
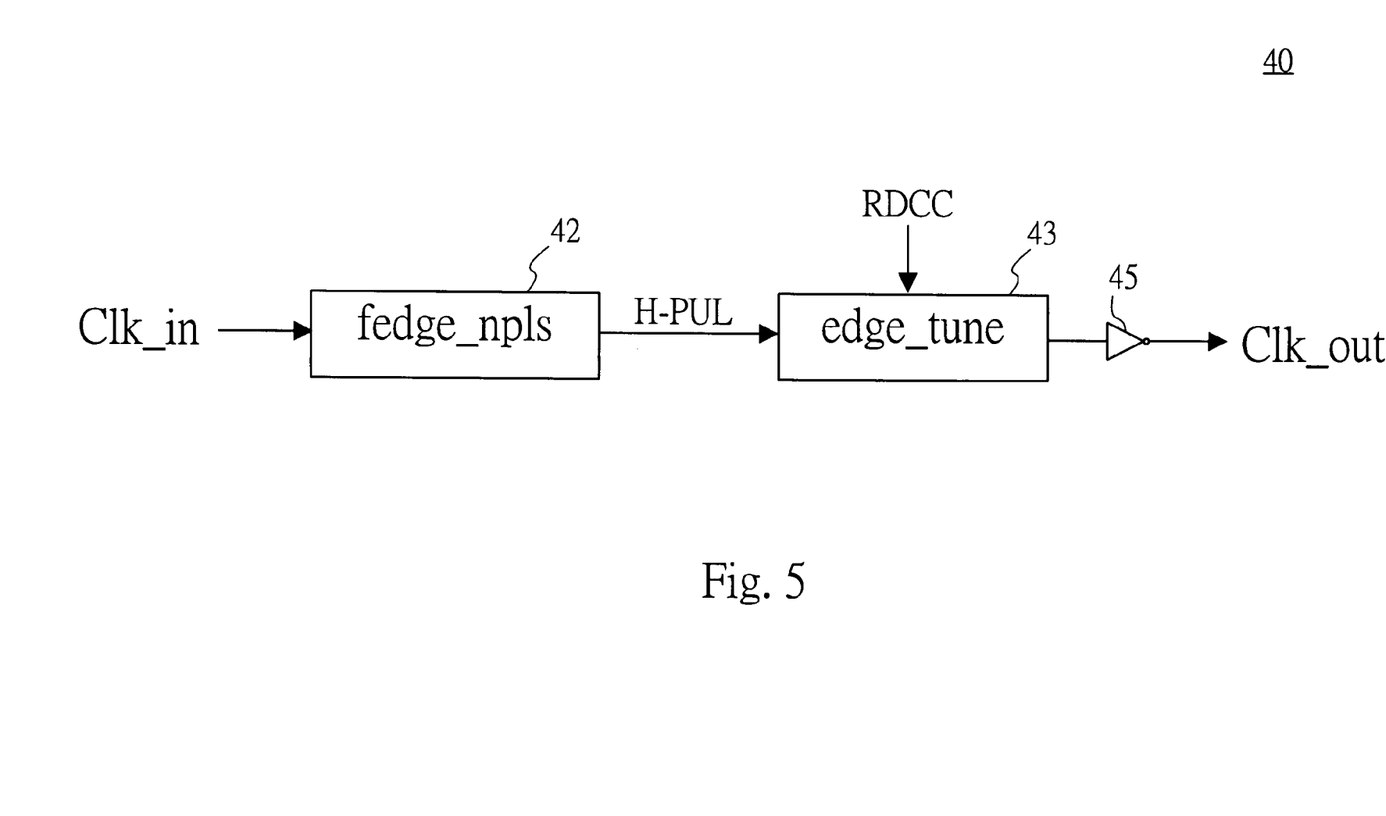
FIG. 5 is a circuit diagram of another tuned circuit of the embodiment of the present invention.

Referring to FIG. 5 is a circuit diagram of another tuned circuit of the embodiment of the present invention. The tuned circuit 40 comprises a pulse generator 42 and a tuner 43.

A pulse generator 42 is used for receiving the input clock (Clk_in), and generating a high level pulse according to the falling edge of the input clock (Clk_in) to form as a periodic high level pulse (H-PUL), wherein the high level pulse (H-PUL) having an initial value is as low level.

The tuner 43 is used for receiving the reference voltage (RDCC), which is feed backing by the low pass filter 27 of the phase lock loop 20, extending the state of the high level of the periodic high level pulse (H-PUL) depending on the reference voltage (RDCC), wherein the state of the high level equals to the state of the low level of the output clock (Clk_out). The tuner 43 further couples to a first inverter 45 of making the phase equaling of the output clock (Clk_out) and the input clock (Clk_in). The execution example is that it only tuning only one edge of clock (the falling edge of the periodic high level pulse) to correct the duty cycle. The corrected result isn't affected by the drifting rising edge of the input clock (Clk_in). The reference voltage (RDCC) is generated from the phase lock loop 20 that is feed backing to the tuned circuit 40, and therefore the delay time of falling edge from the input clock (Clk_in) to the output clock (Clk_out) is fixed and tracked.

Figure 6:
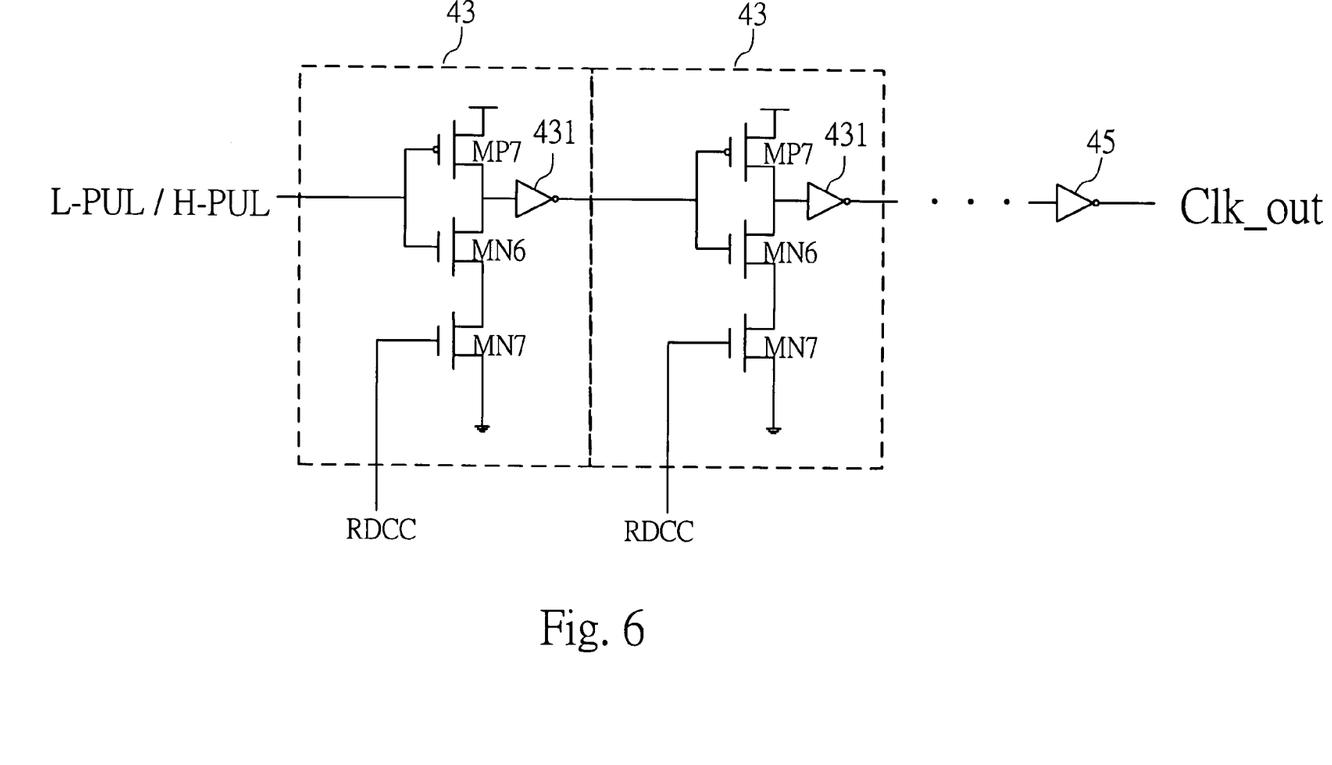
FIG. 6 is a circuit diagram of a tuner of the preferred embodiment of the present invention.

Referring to FIG. 6 is a circuit diagram of a tuner of the preferred embodiment of the present invention. The tuner 43 comprises an inverter 431, MP7, MN6 and MN7 transistor.

The gate of MP7 and MN6 are connected with each other for receiving the periodic low level pulse (L-PUL) or the periodic high level pulse (H-PUL); the drain of MP7 and MN6 and the inverter 431 are connected with each other.

The gate of MN7 is used for receiving the reference voltage (RDCC) which is generated from the low pass filter 27, extending the state of the low level of the periodic high level pulse (H-PUL) according as the reference voltage (RDCC), wherein the state of the low level equals to the state of the high level of the output clock (Clk_out).

The numbers of the tuners 43 are according as extending the state time of the periodic level pulse, and connecting to a plurality of tuners in series to form multistage tuners 43. The finally stage of the tuners 43 further couples to a first inverter 45 of making the output clock (Clk_out) and the input clock (Clk_in) are the same, wherein the output clock (Clk_out) and the input clock (Clk_in) exist a delay time.

Figure 7:
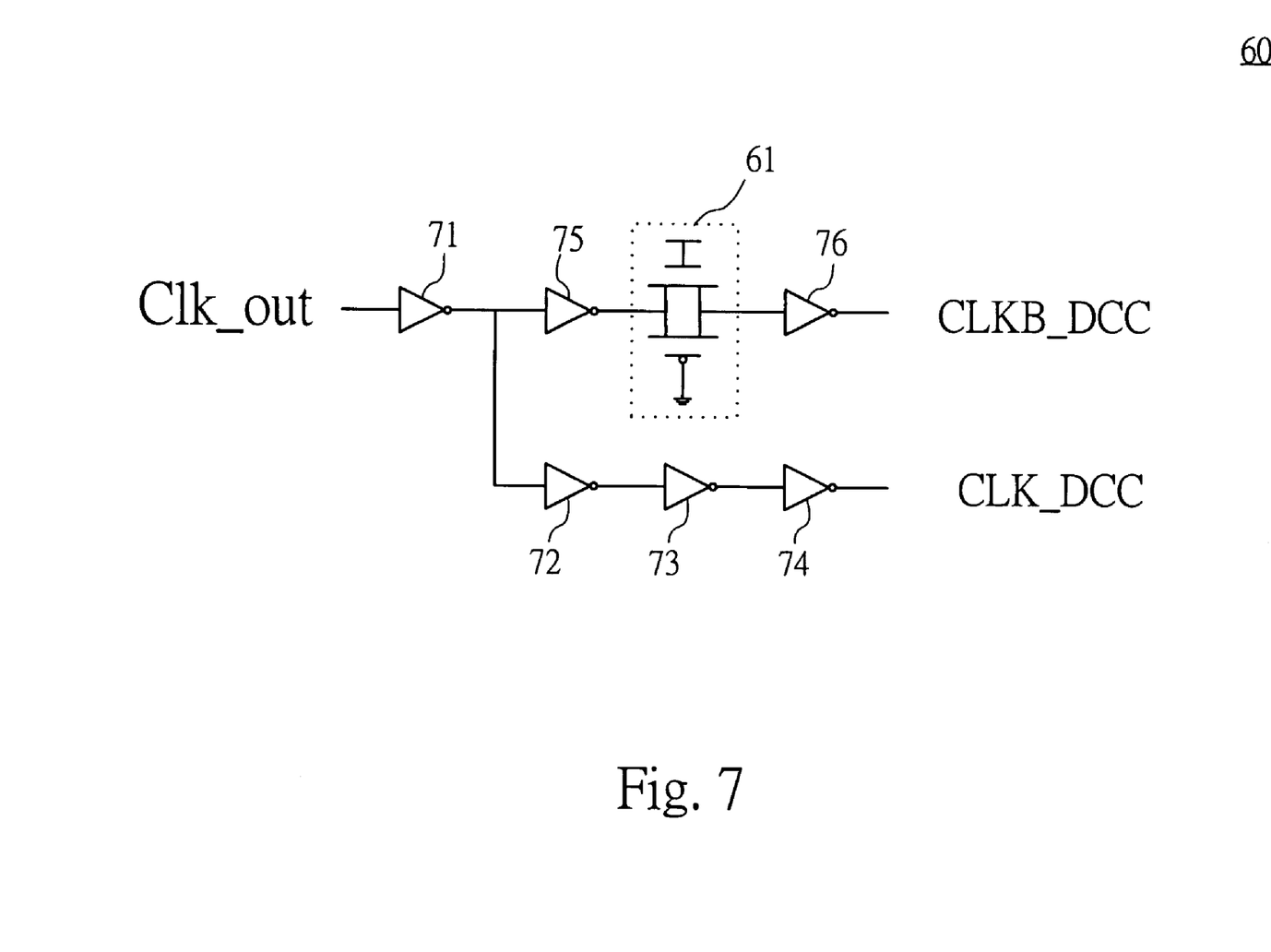
FIG. 7 is a circuit diagram of a delay circuit of the preferred embodiment of the present invention.

Referring to FIG. 7 is a circuit diagram of a delay circuit of the preferred embodiment of the present invention. The delay circuit 60 receives the output clock (Clk_out), generates the second delay clock (CLK_DCC) by inverter 71, 72, 73, and 74, and connects to these inverters in series. The inverter 71, 75, and 76 are connected with in series, amount of which amount are less than the second delay clock (CLK_DCC) by 1, are further connected to a switch 61 for generating the first delay clock (CLKB_DCC).

The function of the switch 61 is as well as the inverter for time delay. The numbers of inverters are depending by the delay time of the duty cycle circuit.

Figure 8:
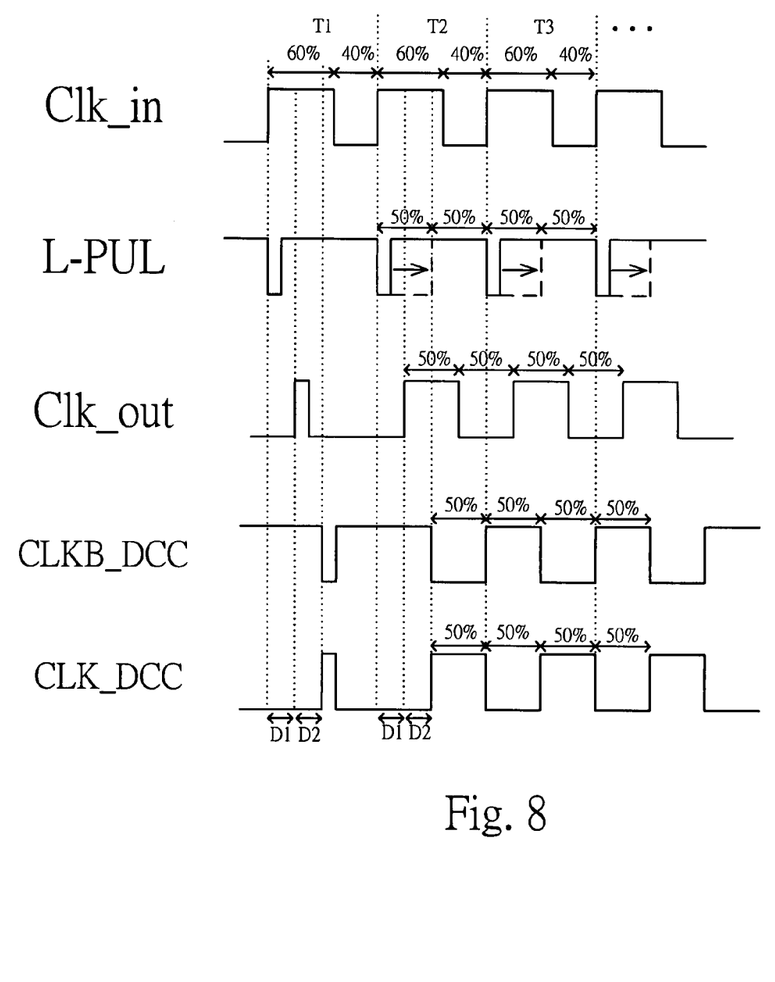
FIG. 8 is a timing diagram of the duty cycle correction circuit of the preferred embodiment of the present invention.

FIG. 8 is a timing diagram of the duty cycle correction circuit of the preferred embodiment of the present invention. Referring to FIG. 8, the state time 60% of the high level of the input clock (Clk_in) is longer than the state time 40% of the low level of the input clock (Clk_in). The tuned circuit 40 receives the rising edge of the input clock (Clk_in), and generates a periodic low level pulse (L-PUL). When the input clock (Clk_in) works in the first period T1, the tuner 43 can't be tune the periodic low level pulse (L-PUL) because the reference voltage (RDCC) hasn't produced yet. After the lapse of the first delay time (D1), the periodic low level pulse (L-PUL) generates an output clock (Clk_out) with high level pulse through the first inverter 45. And after the lapse of the second delay time (D2), the output clock (Clk_out) generates a first delay clock (CLKB_DCC) with low level pulse and a second delay clock (CLK_DCC) with high level pulse through the delay circuit 60. When the input clock (Clk_in) works in the second period T2, the tuner 43 receives the reference voltage (RDCC) which is feed backing by the phase lock loop 20, the extending the state of the low level of the periodic low level pulse (L-PUL) depending on the reference voltage (RDCC), wherein the state of the low level equals the state of the high level of the output clock (Clk_out). Accordingly, the output clock (Clk_out) is generated from the first inverter 45; the duty cycle of the output clock (Clk_out) is corrected to be 50% (equaling the state of low level and the state of high level). Correcting the output clock is generated the first delay clock (CLKB_DCC) and the second delay clock (CLK_DCC) through the delay circuit 60' which both of the duty cycle of the delay clock are 50%.

Figure 9:
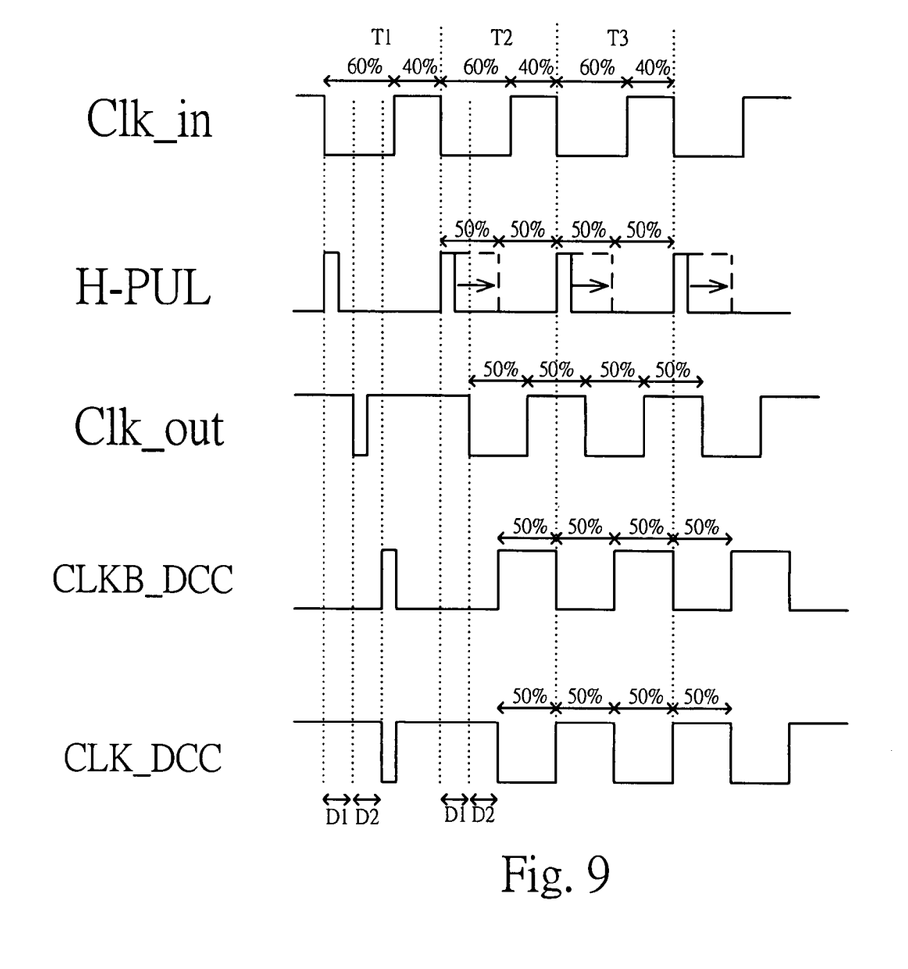
FIG. 9 is a timing diagram of the duty cycle correction circuit of another embodiment of the present invention.

FIG. 9 is a timing diagram of the duty cycle correction circuit of another embodiment of the present invention. Referring to FIG. 9, the state time 60% of the low level of the input clock (Clk_in) is longer than the state time 40% of the high level of the input clock (Clk_in). The tuned circuit 40 receives the falling edge of the input clock (Clk_in), and generates a periodic high level pulse (H-PUL). When the input clock (Clk_in) works in the first period T1, the tuner 43 can't be tune the periodic high level pulse (H-PUL) because the reference voltage (RDCC) hasn't produced yet. After the lapse of the first delay time (D1), the periodic high level pulse (H-PUL) generates an output clock (Clk_out) with low level pulse through the first inverter 45. And after the lapse of the second delay time (D2), the output clock (Clk_out) generates a first delay clock (CLKB_DCC) with high level pulse and a second delay clock (CLK_DCC) with low level pulse through the delay circuit 60. When the input clock (Clk_in) works in the second period T2, the tuner 43 receives the reference voltage (RDCC) which is feed backing by the phase lock loop 20, the extending the state of the high level of the periodic high level pulse (H-PUL) depending on the reference voltage (RDCC), wherein the state of the low level equals the state of the high level of the output clock (Clk_out). Accordingly, the output clock (Clk_out) is generated from the first inverter 45; the duty cycle of the output clock (Clk_out) is corrected to be 50% (equaling the state of low level and the state of high level). Correcting the output clock is generated the first delay clock (CLKB_DCC) and the second delay clock (CLK_DCC) through the delay circuit 60' which both of the duty cycle of the delay clock are 50%.

In summary, it is appreciated that the present invention is related to a duty cycle correction circuit, accordingly, the duty cycle correction can be tracked the delay time between the input clock and the output clock, and drifting that exists in the output clock is reduced.

The foregoing description is merely one embodiment of present invention and not considered as restrictive. All equivalent variations and modifications in process, method, feature, and spirit in accordance with the appended claims may be made without in any way from the scope of the invention.

What is claimed is:

1. A duty cycle correction circuit, comprising:
    a tuned circuit for receiving an input clock and a reference voltage, and generating a periodic low level pulse according to said input clock, tuning said periodic low level pulse depending on said reference voltage, generating an output clock from the output end of said tuned circuit by extending the state of the low level of said periodic low level pulse;
    a delay circuit connected to the output end of said tuned circuit for receiving said output clock, and generating a first delay clock and a second delay clock, wherein both of clocks are complementary signals with each other; and
    a phase lock loop connected to said delay circuit for receiving said first delay clock and said second delay clock, and measuring the state time of the high level and low level of said first delay clock and said second delay clock, generating said reference voltage and feeding it back to said tuned circuit, said phase lock loop including:
    a phase comparator for receiving said first delay clock and said second delay clock to measure the state time of high level and low level of said first delay clock and said second delay clock, said phase comparator including a plurality of transistors, a first capacitor, and a second capacitor;
    a low pass filter including a resistance and a third capacitor, said third capacitor providing said reference voltage, and said low pass filter being connected to said first capacitor; and,
    an operational amplifier, the positive input thereof for receiving said reference voltage, the negative input thereof being coupled to an output thereof to form a voltage follower, and said output being connected to said second capacitor, wherein said second capacitor provides the same value of voltage as said reference voltage.

2. The duty cycle correction circuit of claim 1, wherein said phase lock loop further comprises a bias circuit.

3. The duty cycle correction circuit of claim 2, wherein said bias circuit comprises a plurality of transistors to form as a current mirror circuit for providing at least one bias signal to said phase comparator.

4. The duty cycle correction circuit of claim 1, wherein said tuned circuit comprises:
    a pulse generator for receiving said input clock, and generating a low level pulse according to the rising edge of said input clock to form as said periodic low level pulse, wherein said low level pulse comprises an initial value is as high level; and at least one tuner for receiving said reference voltage, extending the state of the low level of said periodic low level pulse according as said reference voltage, wherein the state of the low level equal to the state of the high level of said output clock.

5. The duty cycle correction circuit of claim 4, wherein said tuner further couples to a first inverter.

6. The duty cycle correction circuit of claim 1, wherein said delay circuit includes a first inverter, a plurality of second inverters and a plurality of third inverters, said delay circuit receives said output clock at an input of said first inverter, said second delay clock being generated by said plurality of third inverters connected in series between an output of said first inverter and a second delay clock output, said first delay clock being generated by said plurality of second inverters connected in series through a switch between said output of said first inverter and said first delay clock output, said plurality of third inverters including a greater number of inverters that said plurality of second inverters.

7. The duty cycle correction circuit of claim 6, wherein the function of said switch is as well as said inverter for time delay.

8. A duty cycle correction circuit, comprising:

a tuned circuit for receiving an input clock and a reference voltage, and generating a periodic high level pulse according to said input clock, tuning said periodic high level pulse depending on said reference voltage, generating an output clock from the output end of said tuned circuit by extending the state of the high level of said periodic high level pulse;

a delay circuit connected to the output end of said tuned circuit for receiving said output clock, and generating a first delay clock and a second delay clock, wherein both of clocks are complementary signals with each other; and a phase lock loop connected to said delay circuit for receiving said first delay clock and said second delay clock, and measuring the state time of the high level and low level of said first delay clock and said second delay clock, generating said reference voltage and feed backing to said tuned circuit, said phase lock loop including:

a phase comparator for receiving said first delay clock and said second delay clock to measure the state time of high level and low level of said first delay clock and said second delay clock, said phase comparator including a plurality of transistors, a first capacitor, and a second capacitor;

a low pass filter including a resistance and a third capacitor, said third capacitor providing said reference voltage, and said low pass filter being connected to said first capacitor; and, an operational amplifier, the positive input thereof for receiving said reference voltage, the negative input thereof being coupled to an output thereof to form a voltage follower, and said output being connected to said second capacitor, wherein said second capacitor provides the same value of voltage as said reference voltage.

9. The duty cycle correction circuit of claim 8, wherein said phase lock loop further comprises a bias circuit.

10. The duty cycle correction circuit of claim 9, wherein said bias circuit comprises a plurality of transistors to form as a current mirror circuit for providing at least one bias signal to said phase comparator.

11. The duty cycle correction circuit of claim 8, wherein said tuned circuit comprises: a pulse generator for receiving said input clock, and generating a high level pulse according to the falling edge of said input clock to form as said periodic high level pulse, wherein said low level pulse comprises an initial value is as high level; and at least one tuner for receiving said reference voltage, extending the state of the high level of said periodic high level pulse according as said reference voltage, wherein the state of the low level equal to the state of the high level of said output clock.

12. The duty cycle correction circuit of claim 11, wherein said tuner further couples to a first inverter.

13. The duty cycle correction circuit of claim 8, wherein said delay circuit includes a first inverter, a plurality of second inverters and a plurality of third inverters, said delay circuit receives said output clock at an input of said first inverter, said second delay clock being generated by said plurality of third inverters connected in series between an output of said first inverter and a second delay clock output, said first delay clock being generated by said plurality of second inverters connected in series through a switch between said output of said first inverter and said first delay clock output, said plurality of third inverters including a greater number of inverters that said plurality of second inverters.

14. The duty cycle correction circuit of claim 13, wherein the function of said switch is as well as said inverter for time delay.

* * * * *